US008202684B2

(12) United States Patent
Hamada et al.

(10) Patent No.: US 8,202,684 B2
(45) Date of Patent: Jun. 19, 2012

(54) METHOD FOR MANUFACTURING PROBE SHEET

(75) Inventors: Kazuhito Hamada, Aomori (JP);
Takashi Akiniwa, Aomori (JP); Satoshi Narita, Aomori (JP)

(73) Assignee: Kabushiki Kaisha Nihon Micronics, Tokyo (JP)

(*) Notice: Subject to any disclaimer, the term of this patent is extended or adjusted under 35 U.S.C. 154(b) by 910 days.

(21) Appl. No.: 12/297,216

(22) PCT Filed: Mar. 27, 2007

(86) PCT No.: PCT/JP2007/057358
§ 371 (c)(1),
(2), (4) Date: Oct. 14, 2008

(87) PCT Pub. No.: WO2007/119636
PCT Pub. Date: Oct. 25, 2007

(65) Prior Publication Data
US 2011/0159444 A1 Jun. 30, 2011

(30) Foreign Application Priority Data
Apr. 14, 2006 (JP) ................................. 2006-111814

(51) Int. Cl.
*G01R 1/073* (2006.01)
*H01L 21/66* (2006.01)
(52) U.S. Cl. ...................................... 430/315; 430/319
(58) Field of Classification Search .................. None
See application file for complete search history.

(56) References Cited

U.S. PATENT DOCUMENTS

| 4,081,601 | A | 3/1978 | Dinella et al. |
| 5,136,470 | A | 8/1992 | Sheridon et al. |
| 5,264,787 | A | 11/1993 | Woith et al. |
| 5,461,326 | A | 10/1995 | Woith et al. |
| 5,468,917 | A | 11/1995 | Brodsky et al. |
| 5,623,213 | A | 4/1997 | Liu et al. |
| 5,703,331 | A | 12/1997 | Brodsky et al. |
| 5,729,896 | A | 3/1998 | Dalal et al. |
| 6,041,495 | A | 3/2000 | Yoon et al. |
| 6,122,815 | A | 9/2000 | Kownacki et al. |
| 6,906,414 | B2 | 6/2005 | Zhao et al. |
| 7,167,373 | B1 | 1/2007 | Hoang et al. |
| 7,323,093 | B2 | 1/2008 | Naito et al. |
| 7,342,402 | B2 | 3/2008 | Kim et al. |
| 7,416,759 | B2 | 8/2008 | Shintate et al. |
| 7,471,095 | B2 | 12/2008 | Narita et al. |
| 7,487,587 | B2 | 2/2009 | Vanfleteren et al. |
| 7,800,001 | B2 | 9/2010 | Hamada et al. |
| 2001/0013423 | A1 | 8/2001 | Dalal et al. |
| 2002/0001056 | A1 | 1/2002 | Sandberg et al. |
| 2004/0212051 | A1 | 10/2004 | Zhao et al. |
| 2006/0231288 | A1 | 10/2006 | Vanfleteren et al. |
| 2008/0197866 | A1* | 8/2008 | Jo .................................. 324/754 |
| 2010/0029099 | A1 | 2/2010 | Hamada et al. |
| 2010/0105224 | A1 | 4/2010 | Narita et al. |

FOREIGN PATENT DOCUMENTS

| JP | 59-009934 | * | 1/1984 |
| JP | 08-327658 | | 12/1996 |
| JP | 10-505162 | | 5/1998 |
| JP | 11-044708 | | 2/1999 |
| JP | 2000-150594 | | 5/2000 |
| JP | 2001-147240 | | 5/2001 |
| JP | 2002-509604 | | 3/2002 |
| JP | 2002-311049 | | 10/2002 |
| JP | 2002-340932 | | 11/2002 |
| JP | 2002-365310 | | 12/2002 |
| JP | 2003-043064 | | 2/2003 |
| JP | 2003-121469 | | 4/2003 |
| JP | 2003-227849 | | 8/2003 |
| JP | 2005-038983 | | 2/2005 |
| WO | 9607924 | | 3/1996 |
| WO | 9743653 | | 11/1997 |
| WO | 2007116795 | | 10/2007 |
| WO | 2007119637 | | 10/2007 |
| WO | 2007119638 | | 10/2007 |
| WO | 2008038468 | | 4/2008 |

OTHER PUBLICATIONS

Computer-generated translation of JP 2005-038983 (Feb. 2005).*
International Search Report for International Patent Application Serial No. PCT/JP20071065787; Japanese Patent Office, Oct. 30, 2007.
International Search Report for International Patent Application Serial No. PCT/JP2007/056751; Japanese Patent Office, Jun. 26, 2007.
International Search Report for International Patent Application Serial No. PCT/JP2007/057358; Japanese Patent Office, Jun. 12, 2007.
International Search Report for International Patent Application Serial No. PCT/JP2007/057359; Japanese Patent Office, Jun. 26, 2007.
International Search Report for International Patent Application Serial No. PCT/JP2007/057362; Japanese Patent Office, Jun. 12, 2007.

* cited by examiner

*Primary Examiner* — John A. McPherson
(74) *Attorney, Agent, or Firm* — Graybeal Jackson LLP

(57) ABSTRACT

An embodiment of the invention provides a method for manufacturing a probe sheet in which a probe tip can be arranged at a predetermined accurate position without the need for troublesome positional adjustment operations of the probe tip in coupling operations of each contactor and a probe sheet main body. It is a method for manufacturing a probe sheet comprising a probe sheet main body having conductive paths and a plurality of contactors formed to be protruded from one surface of the probe sheet main body and connected to the conductive paths. The manufacturing method comprises the steps of forming a plurality of the contactors on a base table by sequentially depositing on the base table metal materials for a plurality of contactors from their respective probe tips toward base portions with use of a photolithographic technique, forming on the base table the probe sheet main body to be coupled with the base portion of each contactor held on the base table, and separating the contactors from the base table integrally with the probe sheet main body.

14 Claims, 13 Drawing Sheets

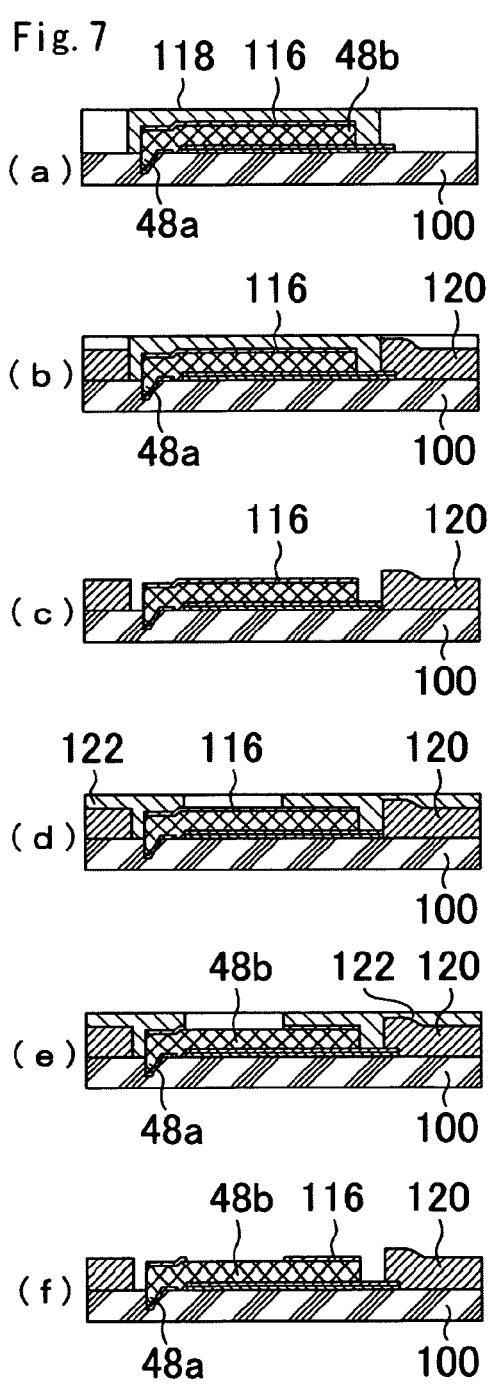
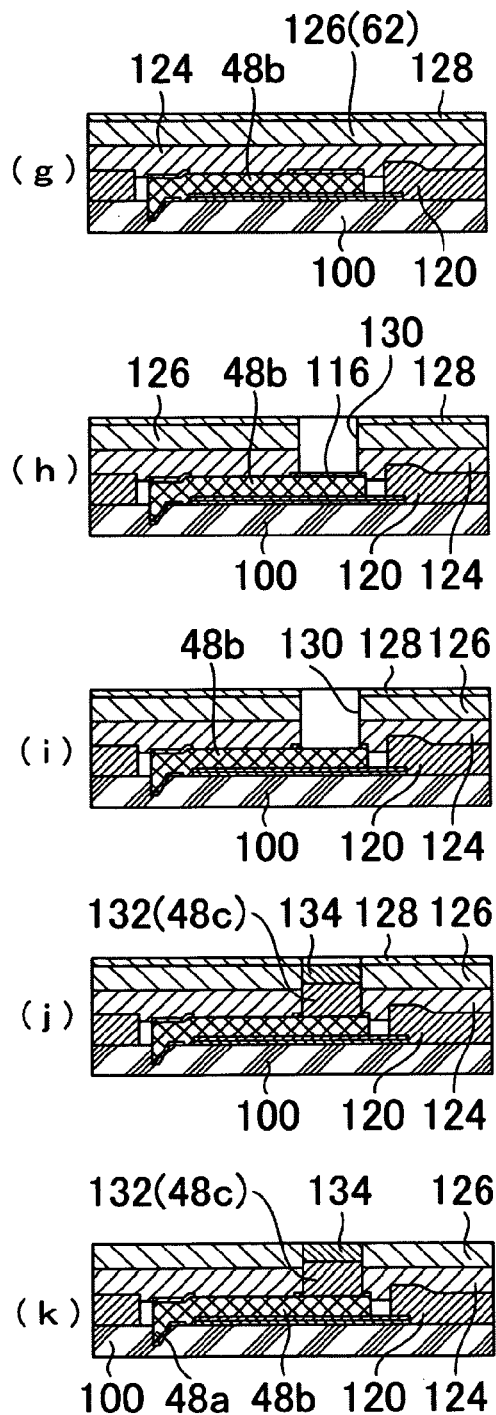
Fig. 7

Fig. 8
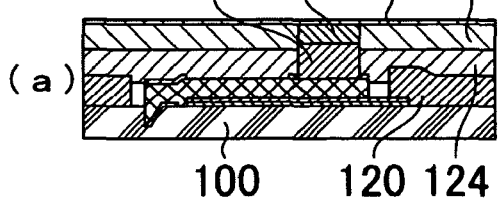
(a)
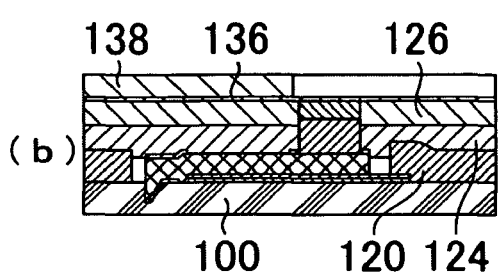
(b)
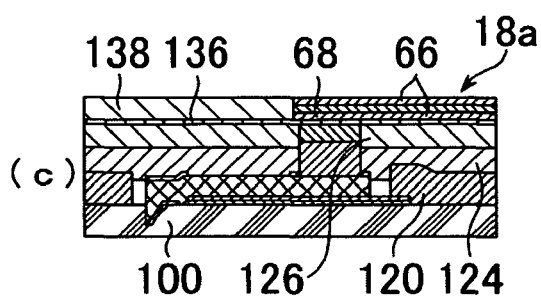
(c)
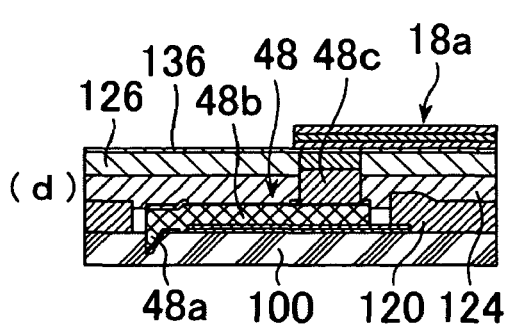
(d)
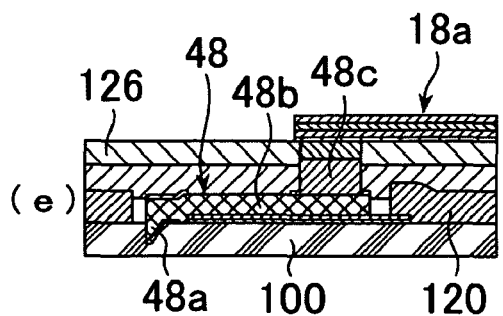
(e)
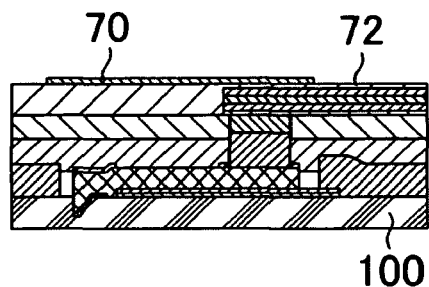
(f)
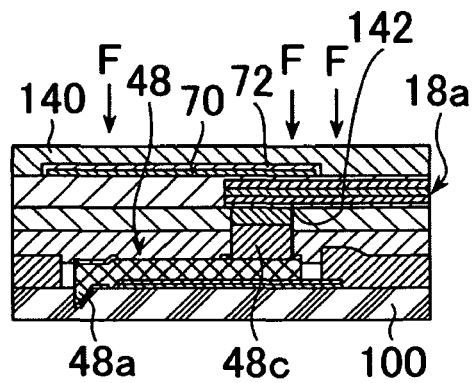
(g)

Fig. 10
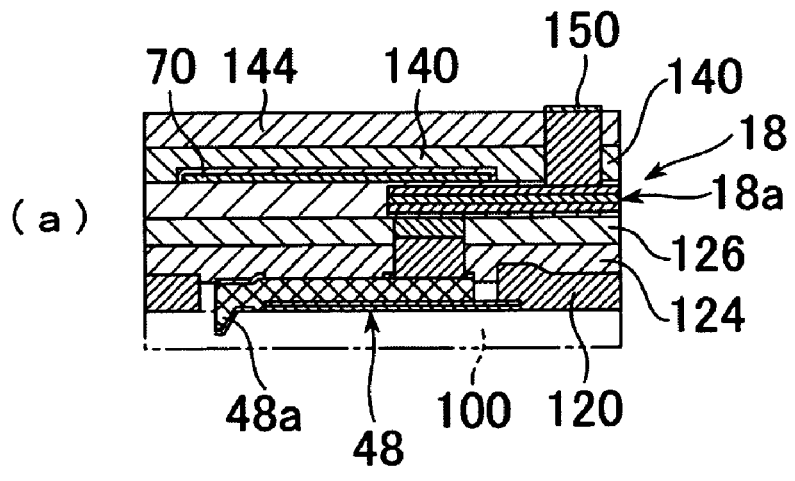
(a)
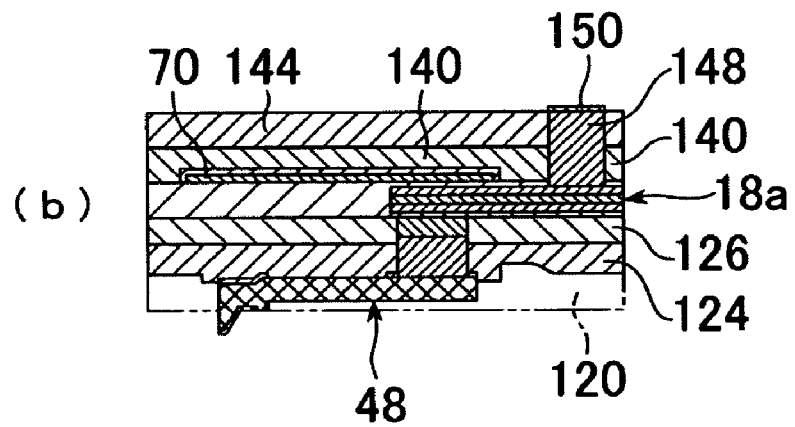
(b)
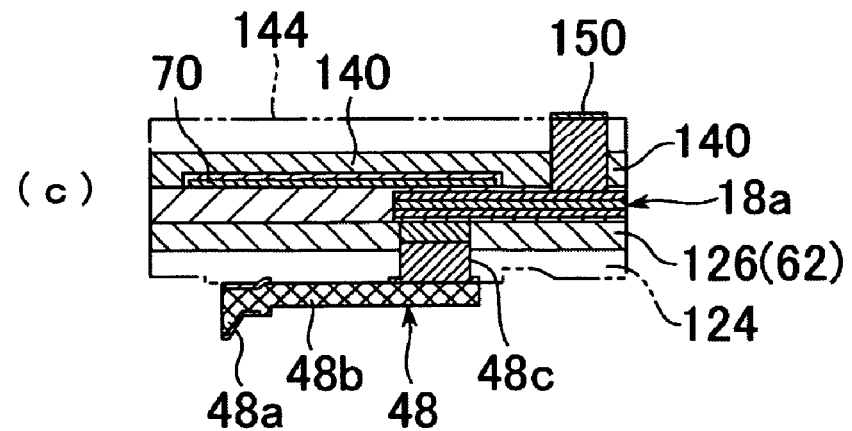
(c)

METHOD FOR MANUFACTURING PROBE SHEET

PRIORITY CLAIM

The present application is a United States national phase application filed pursuant to 35 USC §371 of International Patent Application Serial No. PCT/JP2007/057358, entitled METHOD FOR MANUFACTURING PROBE SHEET, filed Mar. 27, 2007; which application claims priority to Japanese Patent Application Serial No. 2006-111814, filed Apr. 14, 2006; which foregoing applications are incorporated herein by reference in their entireties.

CROSS REFERENCE TO RELATED APPLICATIONS

This application is related to U.S. patent application Ser. No. 12/296,430 entitled ELECTRICAL CONNECTING APPARATUS, filed Oct. 7, 2008, and U.S. application Ser. No. 12/297,214 entitled FLEXIBLE WIRING BOARD AND ELECTRICAL CONNECTING APPARATUS, filed Oct. 14, 2008 and application Ser. No. 12/297,215 entitled PROBE SHEET AND ELECTRICAL CONNECTING APPARATUS, filed Oct. 14, 2008 and which are incorporated herein by reference in their entireties. Also this application is related to U.S. application Ser. No. 12/443,462 entitled ELECTRICAL CONNECTING APPARATUS, filed Mar. 27, 2009.

TECHNICAL FIELD

An embodiment of the present invention relates to a method for manufacturing a probe sheet suitable for use in an electrical test of a flat-plate-shaped device under test such as an integrated circuit or a board for a display apparatus.

BACKGROUND

In a conventional electrical test of this kind, a probe sheet comprising a probe sheet main body having a flexible insulating synthetic resin film and conductive paths supported by the synthetic resin film and a plurality of contactors formed to be protruded from one surface of the probe sheet main body and connected to the conductive paths is used between a tester main body and a device under test (e.g., refer to Japanese Patent Appln. Public Disclosure No. 2002-340932, incorporated by reference).

Each contactor of the probe sheet is connected to an electrical circuit of the tester main body via the conductive path of the probe sheet main body. Also, the probe sheet is applied to the device under test so that the probe tip of each contactor contacts a corresponding electrode of the device under test. By the electrical contact with use of the probe sheet, the device under test is connected to the tester main body.

Meanwhile, in such a probe sheet, the dimensional accuracy and the positional accuracy of the probe tip of each contactor are major issues in order to let the probe tips of the numerous contactors provided on the probe sheet abut to the corresponding electrodes of the device under test accurately.

Thus, in formation of such a probe sheet, each contactor is formed from a tip end as a probe tip toward a base end as a connection end to the probe sheet main body in general (e.g., refer to Japanese Patent Appln. Public Disclosure No. 2003-43064 and Japanese Patent Appln. Public Disclosure No. 2002-509604, which are incorporated herein by reference). After these contactors are respectively formed, they are coupled with the probe sheet main body so that the respective base ends are connected to the corresponding conductive paths of the probe sheet main body.

However, even if each contactor itself is formed highly accurately, it is not easy to fix each contactor to the probe sheet main body so that the probe tip of each contactor is located at a predetermined position accurately in operations to couple each contactor with the probe sheet main body, and an error is easy to occur at the probe tip position of each contactor in these coupling operations. Also, to obtain an accurate probe tip position, troublesome adjustment operations of the probe tip position of each contactor may occur in the coupling operations of each contactor and the probe sheet main body.

SUMMARY

An embodiment of the present invention is a method for manufacturing a probe sheet in which a probe tip can be arranged at a predetermined accurate position without the need for troublesome positional adjustment operations of the probe tip in coupling operations of each contactor and a probe sheet main body.

An embodiment of the present invention is basically a method for manufacturing a probe sheet comprising a probe sheet main body having a flexible insulating synthetic resin film and conductive paths supported by the synthetic resin film and a plurality of contactors formed to be protruded from one surface of the probe sheet main body and connected to the conductive paths, and comprises the steps of forming a plurality of the contactors on a base table by sequentially depositing on the base table metal materials for a plurality of contactors from their respective probe tips toward base portions with use of a photolithographic technique, forming on the base table the probe sheet main body to be coupled with the base portion of each contactor held on the base table, and separating the contactors from the base table integrally with the probe sheet main body.

With the manufacturing method according to an embodiment of the present invention, the plural contactors formed at predetermined positions on the base table are not separated individually, but the probe sheet main body to be coupled with the base portion of each contactor is formed on the base table in a state where the probe tips of these contactors are held at predetermined positions on the base table. Thus, each contactor is integrally coupled with the probe sheet main body during the process of forming the probe sheet main body in a state where its probe tip is held at the predetermined position. Thereafter, the contactor is separated from the base table integrally with the probe sheet main body.

As a result, conventional operations to couple the individual contactors with the probe sheet main body are not needed, and associated troublesome positional adjustment operations of the probe tips of the contactors are not needed. Accordingly, the probe sheet on which the probe tip of each contactor is arranged accurately at a predetermined position can be manufactured more easily than in the conventional case.

A method for manufacturing a probe sheet according to an embodiment of the present invention is a method for manufacturing a probe sheet comprising a probe sheet main body having a flexible insulating synthetic resin film and conductive paths supported by the synthetic resin film and a plurality of contactors formed to be protruded from one surface of the probe sheet main body and connected to the conductive paths, and comprises a first step of forming photoresist taking the form of each probe tip and each arm portion continuing into the probe tip on a base table having formed therein a recess for the probe tip of each contactor with use of a photolithographic technique and forming the probe tip and the arm portion of the contactor by depositing a metal material in the recess formed in the photoresist, a second step of, after removal of the photoresist, forming a sacrificial layer on the end portion of the arm portion and forming a first flexible synthetic resin layer for the probe sheet main body on the sacrificial layer, a third step of forming an opening reaching the arm portion via the flexible synthetic resin layer and the sacrificial layer, a fourth step of forming a base portion continuing into the arm portion of the contactor by depositing a metal material in the opening, and a fifth step of forming on the flexible synthetic resin layer photoresist taking the form of a conductive path passing on the base portion formed in the opening with use of a photolithographic technique and forming on the synthetic resin layer the conductive path coupled with the base portion by depositing a metal material in a recess formed in the photoresist, wherein the contactors are separated from the base table integrally with the probe sheet main body.

As the synthetic resin film or the flexible synthetic resin layer, polyimide may be raised representatively. Also, as the sacrificial layer, a synthetic resin film referred to as a dry film may be used, for example.

The base table may be a stainless steel plate. As the metal material for the contactor, nickel or its alloy may be used. In this case, in the first step, prior to deposition of the metal material for the arm portion on the base table, a nickel layer and a copper layer on the nickel layer may be sequentially laminated. The copper layer contributes to easy detachment of the arm portion from the base table. Also, the nickel layer acts to promote growth of the copper layer on the base table. The metal material for formation of the arm portion may be deposited on the base table via both the layers.

Deposition of the metal material for the arm portion and lamination of the nickel layer and the copper layer may be respectively conducted by a plating technique, and for the arm portion, an electroforming technique, which is one of the plating techniques, may be used.

In the first step, prior to deposition of the metal material for the arm portion on the base table, a harder metal material than the metal material for the arm portion may be deposited in the recess on the base table, and after deposition of the metal material, the metal material for the arm portion may be deposited to cover the metal material. The deposition of the hard metal material enables to form the probe tip of each contactor with the hard metal material, and thus it is possible to heighten abrasion resistance of the probe tip of each contactor and improve durability of each contactor.

Also, by using the photolithographic technique for formation of the probe tip portion including the probe tip, a so-called dovetail coupling structure may be applied to coupling between the probe tip portion and the arm portion formed subsequently, and thus strong coupling may be obtained between both the portions.

As the hard metal material, rhodium or palladium-cobalt alloy may be used, and the metal material may be deposited by a plating technique.

The third step may be conducted by irradiation of laser beam to the first flexible synthetic resin layer and the sacrificial layer in a state where the upper surface of the arm portion under the sacrificial layer is protected by a protective film.

As the protective film, the plated copper layer may be used, and the plated copper layer may be formed on the upper surface of the arm portion prior to the second step.

In the fourth step, the same material as the metal material for the arm portion may be deposited in the opening at a height position that exceeds the height position of the sacrificial layer and that does not exceed the first flexible synthetic resin layer, and subsequently the same material as the metal material for the conductive path may be deposited in the opening on the base portion within the thickness dimension of the first flexible synthetic resin layer. By depositing the same material as the metal material for the arm portion in the opening, the base portion of the contactor is formed. Also, by depositing the same material as the metal material for the conductive path in the opening, the connection boundary between the base portion of the contactor and the conductive path made of a different metal material from the metal material constituting the base portion can be located substantially within the first flexible synthetic resin layer, and the connection boundary between both the metals can be protected by the first flexible synthetic resin layer.

In the fifth step, a first conductive material, a second conductive material having higher toughness than that of the first conductive material, and the first conductive material for the conductive path may be sequentially laminated on the first flexible synthetic resin layer. Thus, the conductive path may be in a three-layered structure, and the strength of the conductive path against breakage may be heightened.

The first conductive material may be copper, and the second conductive material may be nickel or its alloy. These may be sequentially deposited on the first flexible resin by a plating technique.

In the fifth step, after formation of the conductive path, a reinforcing plate covering the upper region of the contactor may be fixed over the first flexible synthetic resin layer and the conductive path via an adhesive sheet. The arrangement of the reinforcing plate restricts deformation by an external force or deformation by thermal expansion or contraction on the contactor area provided with the contactors of the probe sheet main body and restricts displacement in the probe tip positions of the contactors caused by these deformations.

In a sixth step, a second flexible synthetic resin layer covering the conductive path formed on the first flexible synthetic resin layer may be formed. By locating the conductive path between the second and first flexible synthetic resin layers as a result of formation of this second flexible resin layer, the conductive path may be buried in the synthetic resin film consisting of both the flexible synthetic resin layers.

In a seventh step, a sacrificial layer may be formed on the second flexible synthetic resin layer, an opening reaching the conductive path via the second flexible synthetic resin layer and the sacrificial layer formed on the second flexible synthetic resin layer may be formed, and a metal material may be deposited in the opening. By this deposition of the metal material, a bump for the conductive path can be formed.

In an eighth step, the surface of the bump may be abraded to correspond to the surface of the sacrificial layer on the second flexible synthetic resin layer, and thus the respective electrical connections between the probe sheet and e.g., the rigid wiring board to which the probe sheet is connected can be done reliably. Also, after the aforementioned abrasion of the bump surface, the probe sheet main body may be detached from the base table integrally with the contactor, and thereafter each sacrificial layer remaining on the probe sheet may be removed.

Further, in a ninth step, by arranging the outer shape of the probe sheet main body formed by burying the conductive path in the first and second flexible synthetic resin layers, sequential steps from formation of the probe tip to arrangement of the outer shape of the probe sheet main body for completion of the probe sheet can be performed by a continuous operation.

According to an embodiment of the present invention, the plural contactors formed at predetermined positions on the base table are not separated individually, but the probe sheet main body to be coupled with the base portion of each contactor is formed on the base table in a state where the probe tips of these contactors are held at predetermined positions on the base table, and thereafter, the contactor is separated from the base table integrally with the probe sheet main body. Thus, conventional operations to couple the individual contactors with the probe sheet main body are not needed. Also, troublesome positional adjustment operations of the probe tips of the contactors in association with these conventional coupling operations are not needed. Accordingly, the probe sheet on which the probe tip of each contactor is arranged to align in the same plane accurately at a predetermined position can be manufactured more easily than in the conventional case.

BRIEF DESCRIPTION OF THE DRAWINGS

FIG. 7 is a process description diagram (No. 2) showing a process for manufacturing the probe sheet according to an embodiment of the present invention.

FIG. 8 is a process description diagram (No. 3) showing a process for manufacturing the probe sheet according to an embodiment of the present invention.

FIG. 10 is a process description diagram (No. 5) showing a process for manufacturing the probe sheet according to an embodiment of the present invention.

Figure 1:
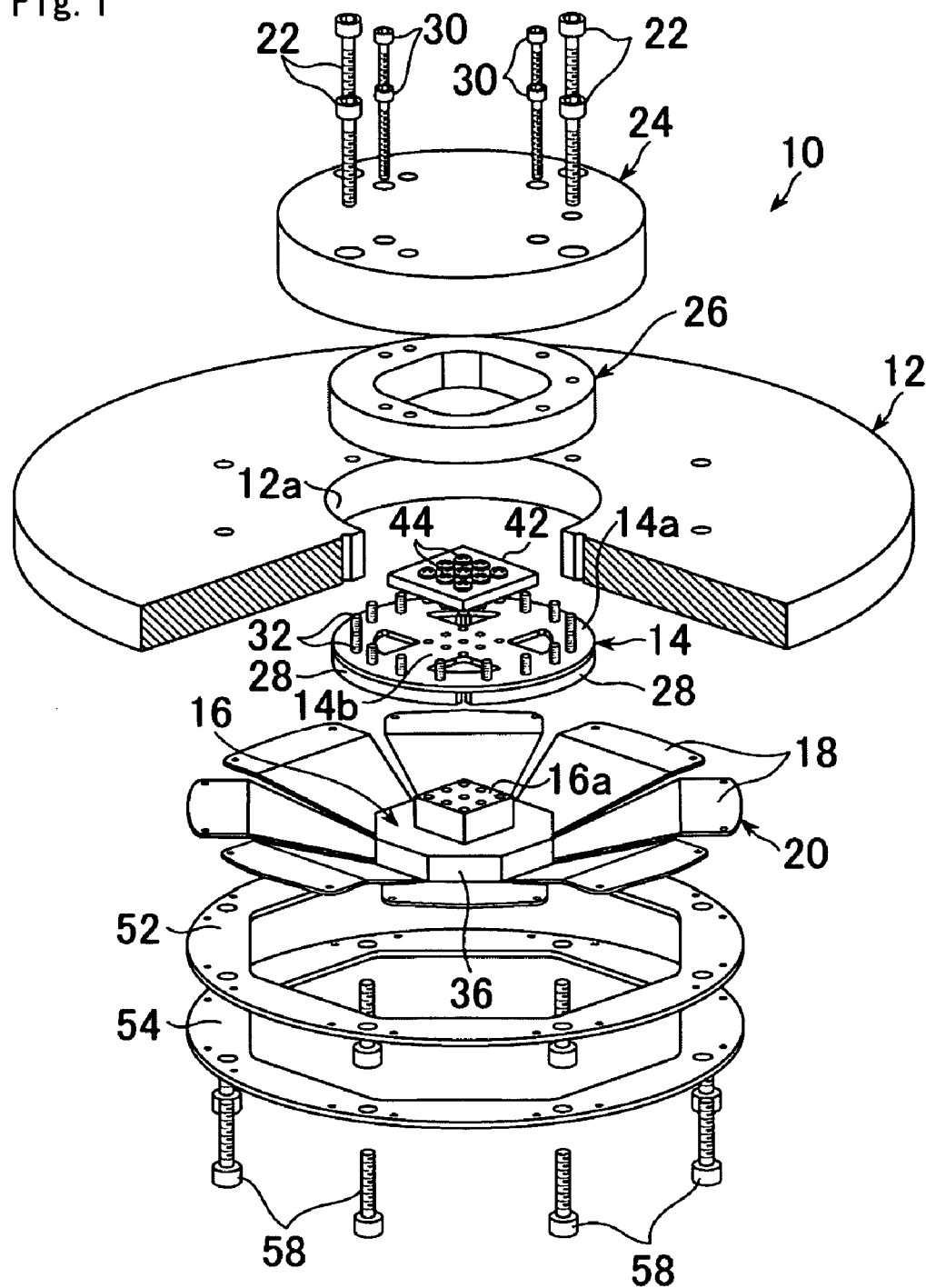
FIG. 1 is an exploded perspective view of a probe assembly in which a flexible wiring board according to an embodiment of the present invention has been incorporated.

REFERENCE KEY 10 probe assembly
12 rigid wiring board
14 spring member
16 block
18 probe sheet main body (flexible wiring board)
18a conductive path
20 probe sheet
48 contactor (probe)
48a probe tip of the contactor
48b arm portion of the contactor
48c base portion of the contactor
50 contactor area
62, 64 electrical insulating synthetic resin film
66 first conductive material layer
68 second conductive material layer
70 plate-shaped member (ceramic plate)
100 base table
102 recess
116 copper layer (protective layer)
130 opening

DETAILED DESCRIPTION

A probe assembly 10 according to an embodiment of the present invention comprises a rigid wiring board 12, a block 16 elastically supported on the rigid wiring board via a spring member 14, and a probe sheet 20 having a flexible wiring board 18 provided with a plurality of conductive paths 18a (refer to FIG. 4) electrically connected respectively to a plurality of not shown wiring paths on the rigid wiring board 12, as shown in FIG. 1, which shows this in an exploded manner. In the present embodiment, the flexible wiring board 18 is used as a probe sheet main body of the probe sheet 20.

The rigid wiring board 12 has a plate-shaped electrical insulating base material made of epoxy resin containing e.g., glass fiber and wiring paths on the base material, as is well known as a conventional rigid printed wiring board. The aforementioned wiring paths on the rigid wiring board 12 are connected to electrical circuits of a not shown tester main body. In the example shown in the figures, a circular rigid wiring board having a circular opening 12a at the center is used as the rigid wiring board 12.

The spring member 14 is made of a plate-shaped spring material and comprises an annular support portion 14a having a smaller outer diameter than a diameter of the circular opening 12a of the rigid wiring board 12 and a crosshair main body portion 14b arranged across the inside of the annular support portion.

Figure 2:
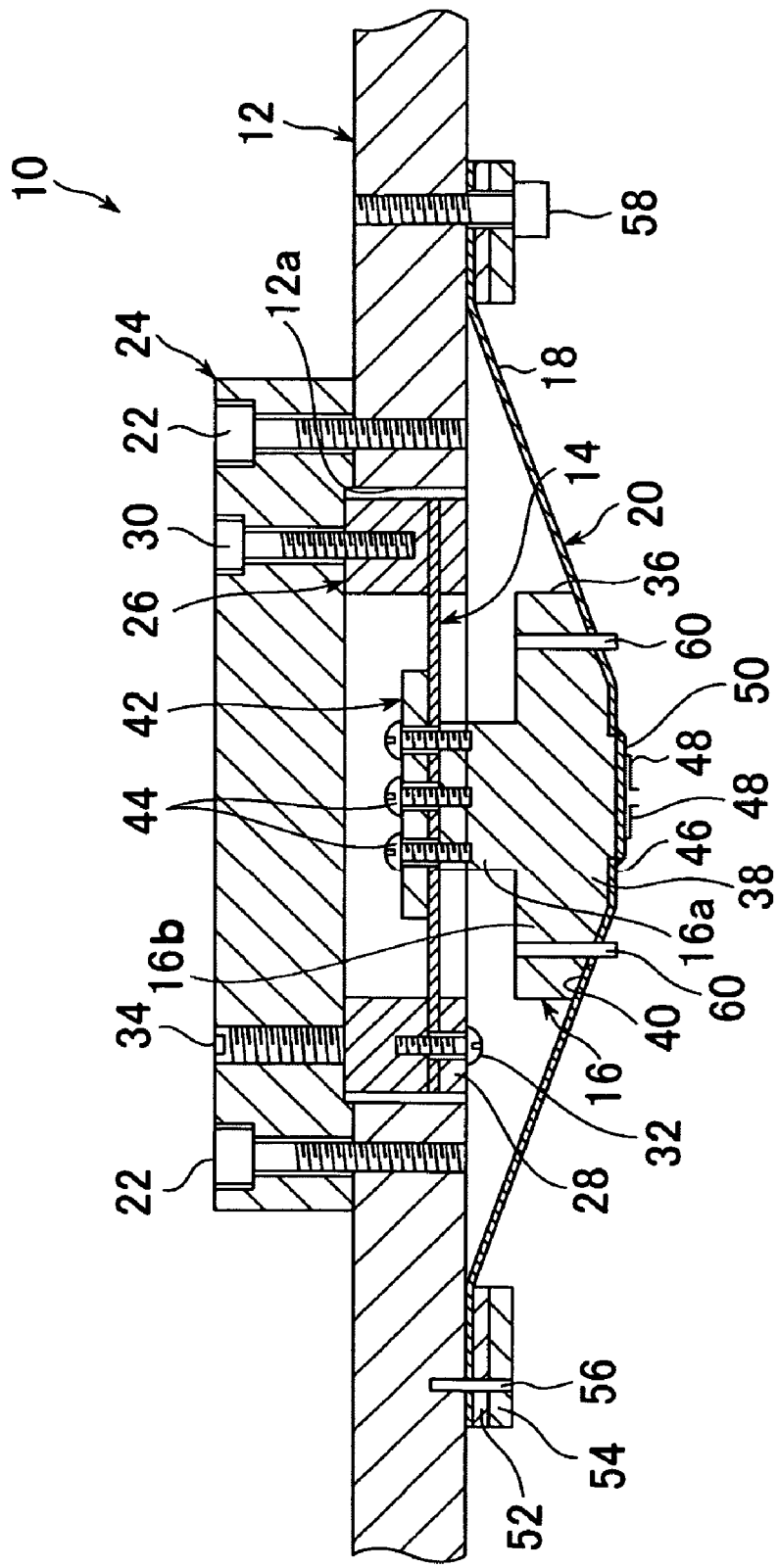
FIG. 2 is a vertical cross-sectional view of the probe assembly shown in FIG. 1.

On the upper surface of the rigid wiring board 12 is fixed a circular support plate 24 made of a metal such as stainless steel via bolts 22 screwed in the rigid wiring board 12 at parts not in the way of the aforementioned wiring paths, as shown in FIG. 2. The support plate 24 supports the rigid wiring board 12 and exerts a reinforcement effect on the rigid wiring board.

The spring member 14 is held in the circular opening 12a via an annular attachment plate 26 and a plurality of thrusting plates 28 annularly combined to one another sandwiching its annular support portion 14a from its both sides. For holding of this spring member 14, the attachment plate 26 is coupled on the lower surface of the support plate 24 by bolts 30, and each thrusting plate 28 is coupled with the attachment plate 26 by bolts 32 passing through the thrusting plate and the aforementioned support portion 14a of the spring member 14 and screwed in the attachment plate 26. In this manner, the spring member 14 is held in the circular opening 12a to go across the opening.

Also, as shown in FIG. 2, a parallelism adjustment screw member 34 for adjusting the holding posture of the spring member 14 in a state in which the bolts 30 are loosened is screwed in the support plate 24 so that its tip end can abut to the top surface of the attachment plate 26.

The aforementioned block 16 is fixed at the main body portion 14b of the spring member 14 held in the circular opening 12a of the rigid wiring board 12. The block 16 comprises a stem portion 16a having a rectangular cross-section and a support portion 16b connected to the lower edge of the stem portion and having an equilateral octagonal cross-sectional shape in the example shown in the figures. The support portion 16b has a pedestal portion 36 having a predetermined diameter along its axis line and a bottom portion 38 connected to the pedestal portion and having a cross-sectional shape analogous to the cross-sectional shape of the pedestal portion. The bottom portion 38 gradually decreases toward the lower edge its lateral dimension or its diameter across the axis line of the support portion 16b. Accordingly, the block 16 has tapered surfaces 40 at its bottom portion 38, and eight flat tapered surfaces 40 (refer to FIG. 3) are formed in the example shown in the figures.

Referring to FIG. 2 again, the block 16 is coupled with the main body portion 14b of the spring member 14 at the top surface of the stem portion 16a with the bottom portion 38 of its pedestal portion 36 directing downward. For this coupling, a fixing plate 42 sandwiching the main body portion 14b in cooperation with the stem portion 16a is fixed to the stem portion 16a by screw members 44 screwed in the stem portion 16a.

Figure 3:
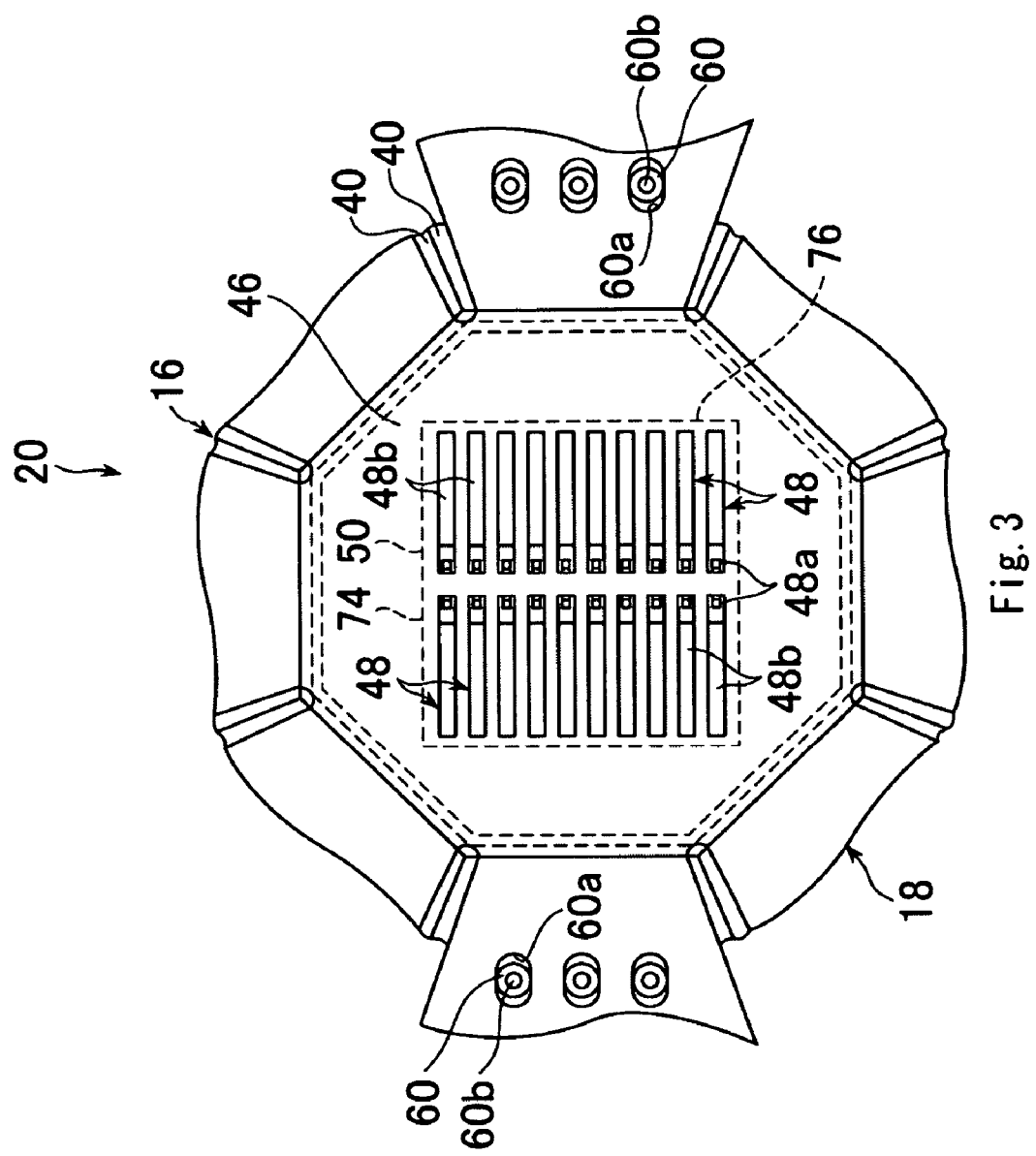
FIG. 3 is a partially enlarged bottom view of a probe sheet of the probe assembly shown in FIG. 1.

Also, the flexible wiring board 18 or the probe sheet main body 18 of the probe sheet 20 has an octagonal portion 46 formed at its center portion to correspond to the bottom portion 38 of the block 16, and at the center portion of the octagonal portion is formed a contactor area 50 at which numerous probes 48 are arranged with their probe tips 48a arrayed, as shown in FIG. 3. This contactor area 50 is formed in a rectangular shape in the example shown in FIG. 3.

The probe sheet 20 is attached to the lower surface of the bottom portion 38 via adhesive as described later, with the probe tips 48a of the numerous probes 48 protruded from the contactor area 50 of its probe sheet main body 18 directing downward, so that the octagonal portion 46 is supported on the bottom portion 38 of the block 16 at its back surface, as shown in FIG. 2. Also, as for the probe sheet 20, its outer edge portions are coupled with the rigid wiring board 12 so that portions extending outward from the octagonal portion 46 are slightly slack. For coupling of the aforementioned outer edge portions of the probe sheet 20, an elastic rubber ring 52 is arranged along the outer edge portions of the probe sheet 20, and a ring bracket 54 covering the elastic rubber ring 52 is also arranged. The relative positions of the outer edge portions of the probe sheet 20 and both the members 52, 54 against the rigid wiring board 12 are determined by positioning pins 56. By tightening of screw members 58 passing through the probe sheet 20 and both the members 52, 54 into the rigid wiring board 12, the outer edge portions of the probe sheet 20 are coupled with the rigid wiring board 12. By coupling of the aforementioned outer edge portions with the rigid wiring board 12, the aforementioned conductive paths 18a in the probe sheet 20 are electrically connected to the aforementioned corresponding wiring paths on the rigid wiring board 12, as in the conventional case.

In the example shown in FIGS. 2 and 3, alignment pins 60 are arranged to pass through elongated holes 60a (refer to FIG. 3) provided in the probe sheet 20. The lower edges of the alignment pins 60 are provided with alignment marks 60b that can be captured by a camera supported on a table (not shown).

Since relative positional information of the probe assembly 10 to the table supporting a device under test can be obtained from captured images of these alignment marks, the relative position of the probe assembly 10 to the aforementioned support table is adjusted based on this positional information so that the probe tips 48a of the respective probes 48 of the probe assembly 10 contact corresponding electrodes of the device under test on the aforementioned table accurately. Thereafter, as a result of the electrical contact between the probe tips 48a of the respective probes 48 and the aforementioned corresponding electrodes, an electrical test of the aforementioned device under test is performed in the aforementioned tester main body.

Figure 4:
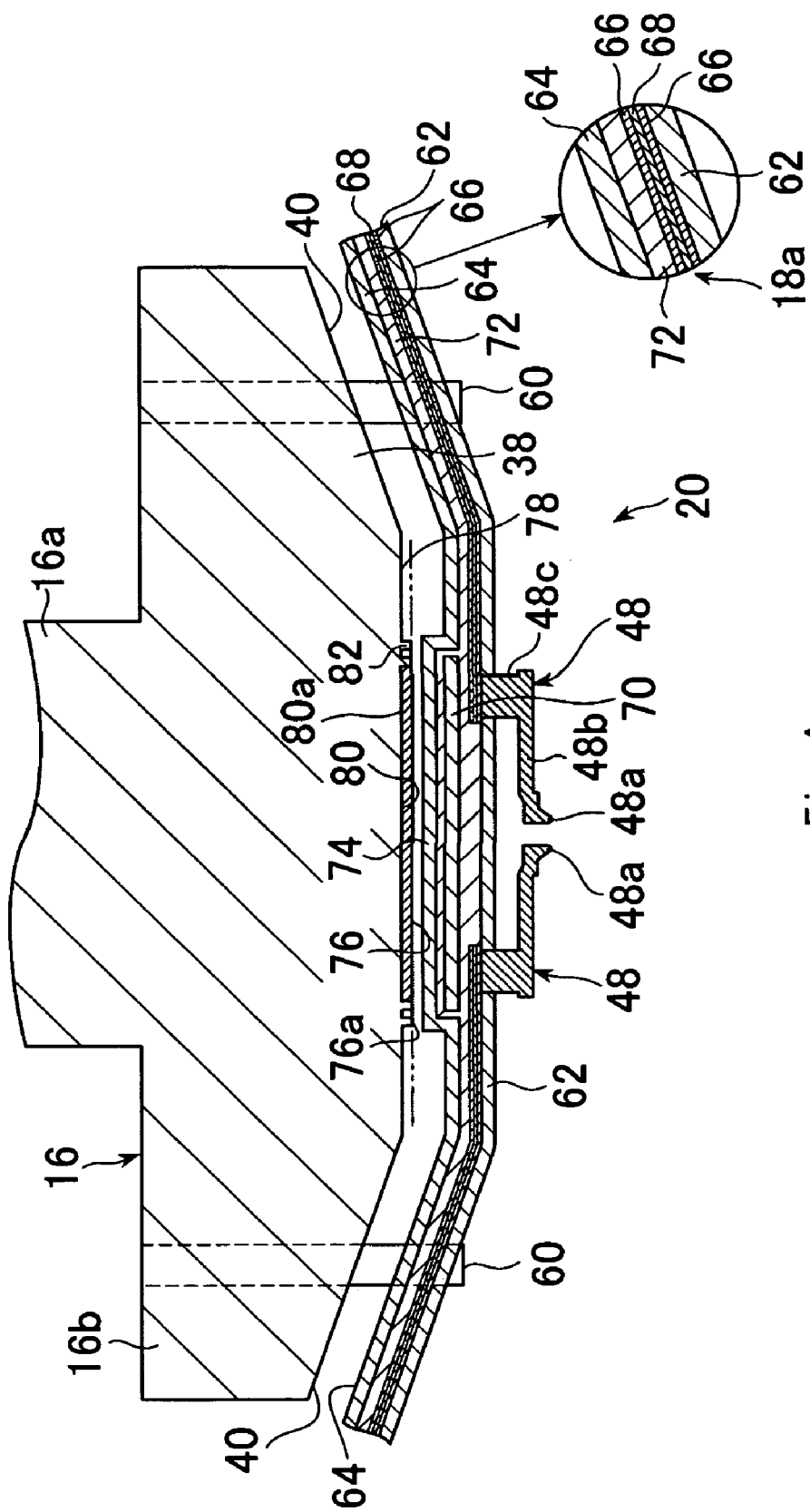
FIG. 4 is a vertical cross-sectional view showing a state before the probe sheet and a support block shown in FIG. 1 are coupled.

The structure of the aforementioned probe sheet 20 is described in details with reference to FIG. 4. The probe sheet 20 has a pair of flexible electrical insulating synthetic resin films 62, 64 such as polyimide resin, and the conductive paths 18a are buried between both the resin films.

In the probe assembly 10 according to an embodiment of the present invention, the conductive path 18a has a laminated structure having first conductive material layers 66 made of a metal material, such as copper, having high conductivity suitable for use as an electrical wire and a second conductive material layer 68 made of a metal material, such as nickel or nickel-phosphor alloy, having higher toughness than that of the first conductive material layers. The example shown in FIG. 4 adopts a three-layered sandwich structure in which a single second conductive material layer 68 is sandwiched between a pair of first conductive material layers 66.

The resiliencies of the two kinds of metals can be compared by deriving respective stress-strain curves of both the metals having the same shapes and dimensions from e.g., impact tests, and comparing the areas each bounded by each of the stress-strain curves extending to a point where each of these metals reaches breakage. In the case of comparison between copper and nickel, the area bounded by the stress-strain curve derived from nickel is larger than that derived from copper. Thus, it can be said that nickel is a material harder to be broken than copper, that is, a highly tough material.

Since each of both the first conductive material layers 66 is deposited to have a thickness of e.g., 10 micrometers, and the second conductive material layer 68 is deposited to have a thickness of e.g., 2 micrometers, the conductive path 18a has a thickness dimension of e.g., approximately 22 micrometers. These metal layers 66, 68 may be deposited by an electroplating method as described later.

To each conductive path 18a is connected the base portion of the probe 48 protruded from one electrical insulating synthetic resin film 62. Also, corresponding to the contactor area 50 (refer to FIG. 3) to which each probe 48 is arranged, a plate-shaped reinforcing plate 70 made of, for example, a ceramic plate having approximately the same size and shape as those of the contactor area is buried between both the electrical insulating synthetic resin films 62, 64 to partially cover the conductive paths 18a. This reinforcing plate 70 can be fixed between both the electrical insulating synthetic resin films 62, 64 via an adhesive sheet 72 such as a synthetic resin sheet, as shown in the figure. Since the reinforcing plate 70 has higher rigidity than that of the electrical insulating synthetic resin films 62, 64, it acts to restrict deformation of an area of the probe sheet main body 18 corresponding to the reinforcing plate 70 by an external force.

Although another plate-shaped member may be used as the reinforcing plate, a ceramic plate may be used because it is light and less likely suffers from thermal deformation. Since the reinforcing plate 70 made of the ceramic plate less likely suffers from deformation by thermal expansion or contraction, it effectively restricts deformation of the probe sheet main body 18 by thermal expansion or contraction as well as the aforementioned deformation of the probe sheet main body 18 by an external force.

The aforementioned reinforcing plate 70 is arranged between the electrical insulating synthetic resin films 62, 64 on a side of each conductive path 18a opposite a side provided with a connection portion between the conductive path and each probe 48 as a contactor. This arrangement enables the reinforcing plate 70 to be arranged to cover the entire area of the contactor area 50 without the need for any special geometric process to the single plate-shaped member 70 for prevention of interference with each probe 48 or contactor 48.

Also, by burying the reinforcing plate 70, a protrusion 74 corresponding to the reinforcing plate 70 is formed in the other electrical insulating synthetic resin film 64 forming the back surface of the probe sheet main body 18 in a state prior to fixation of the probe sheet main body 18 of the probe sheet 20 to the block 16, as shown in FIG. 4. On the other hand, no such protrusion corresponding to the reinforcing plate 70 is formed in the electrical insulating synthetic resin film 62 forming the front surface of the probe sheet main body 18.

On the lower surface of the bottom portion 38 of the block 16 receiving the back surface of the probe sheet main body 18 is formed a flat rectangular support surface 76 corresponding approximately to the contactor area 50 as shown in FIG. 4. This support surface 76 is formed at the center part of the bottom portion 38, and an octagonal flat step 78 surrounding the center part causes the support surface 76 to be formed so as to be protruded downward from the step. Thus, the tapered surfaces 40 communicate with the support surface 76 via the step 78 between the tapered surfaces and the support surface 76.

In the support surface 76 formed to be protruded downward from the flat step 78 is opened downward a rectangular center recess 80 for housing adhesive 80a. The center recess 80 is formed in a slightly smaller flat surface shape than that of the contactor area 50. As a result of formation of the center recess 80, an annular flat support surface part 76a surrounding the center recess 80 remains on the support surface 76. The support surface part 76a is formed to have a size appropriate to receiving the edge portion of the reinforcing plate 70, and in the support surface part 76a is formed an annular groove 82 surrounding the recess 80.

For attachment of the probe sheet 20 to the block 16, the adhesive 80a is supplied to the center recess 80. Also, similar adhesive is supplied to the step 78 surrounding the support surface 76 as well.

Figure 5:
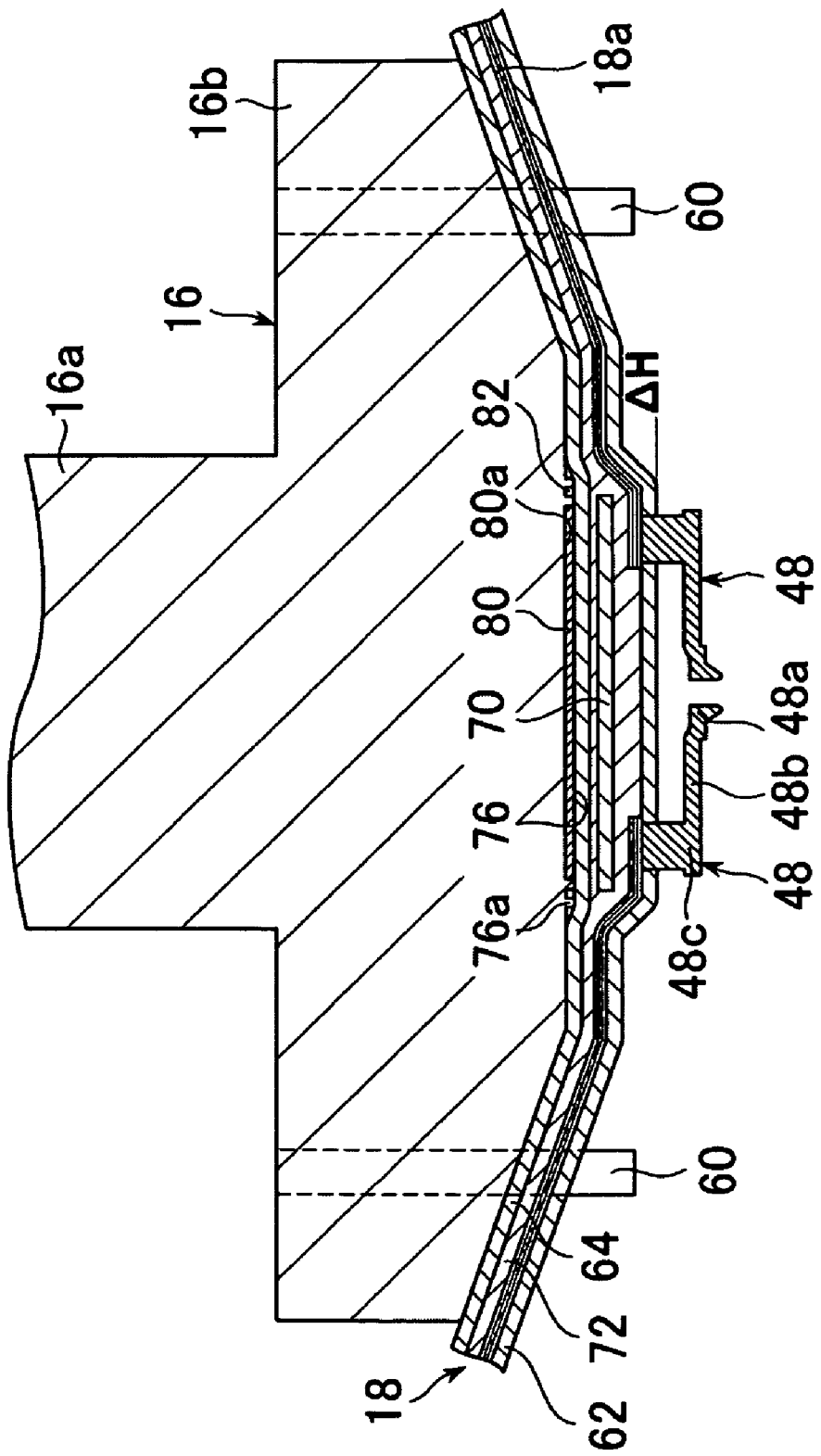
FIG. 5 is a partially enlarged vertical cross-sectional view showing a state after the probe sheet and the support block shown in FIG. 4 have been coupled.

After the aforementioned supply of the adhesive to the block 16, the relative position between the probe sheet 20 and the block 16 is determined so that the outer edge portion of the protrusion 74 of the probe sheet main body 18 is opposed to the support surface part 76a as shown in FIG. 4. Under this state, the probe sheet main body 18 is thrust toward the lower surface of the bottom portion 38 of the block 16 as shown in FIG. 5.

As a result of this thrust, the protrusion 74 of the probe sheet main body 18 disappears, and on the contrary the probe sheet main body 18 is deformed to be in a recessed shape so that its back surface extends along the step 78 and the support surface 76, which causes the probe sheet main body 18 to be fixed on the support surface 76 and the step 78 as the lower surface of the bottom portion 38 (except the tapered surfaces 40).

Also, when the back surface of the probe sheet main body 18 is deformed to extend along the step 78 and the support surface 76, the probe sheet main body 18 is deformed entirely in its thickness direction. At this moment, at an area corresponding to the outer edge of the support surface 76, a strong shearing stress acts on the conductive paths 18a due to the step difference between the support surface and the step 78.

However, with the probe sheet 20 according to an embodiment of the present invention, since its conductive paths 18a are reinforced by the second conductive material layers 68 showing high toughness, the conductive paths 18a will not be broken by such a shearing force. Also, the reinforcement effect of the second conductive material layers 68 may prevent breakage of the conductive paths 18a reliably in an after-mentioned process for manufacturing the probe sheet 20 as well.

In the aforementioned attachment work of the probe sheet main body 18 to the block 16, since the excess of the adhesive 80a supplied to the recess 80 is housed in the annular groove 82 when the probe sheet main body 18 receives the aforementioned thrusting force, this excess will not go over the support surface part 76a and run off into the step 78.

Also, as a result of the aforementioned thrust of the probe sheet main body 18 to the block 16, the sum of the step difference between the step 78 and the support surface 76 and the thickness of the reinforcing plate 70 appears as a step difference $\Delta H$ of the surface of the probe sheet main body 18 at the same time of the aforementioned disappearance of the protrusion 74. Consequently, the contactor area 50 of the probe sheet main body 18 is protruded downward from its circumferential portion by the step difference $\Delta H$.

This step difference $\Delta H$ may contribute to increase of the distance between the outward part of the contactor area 50 of the probe sheet main body 18 and the aforementioned device under test. This increase of the distance prevents interference between the outward part of the contactor area 50 of the probe sheet main body 18 and the aforementioned device under test more reliably and prevents contamination or damage of the aforementioned device under test caused by the interference of both the parts more reliably.

Even in a case where the reinforcing plate 70 is not used, the support surface 76 may be protruded from its circumferential part to obtain a step difference $\Delta H$ corresponding to the protrusion of the support surface 76. However, it is preferable to use the reinforcing plate 70 since doing so will lead to obtaining of a larger step difference $\Delta H$, easy handling of the probe sheet 20, and prevention of misalignment of the probe tips 48a of the probes 48 on the xy plain and misalignment with respect to the position in the z direction as a height position of each probe tip.

For example, at the time of manufacturing of the probe sheet 20, however well the probe tips 48a of the probes 48 are aligned, the aligned posture of each probe 48 is misaligned when deformation by an external force or deformation by thermal expansion or contraction occurs on the contactor area 50 during handling of it, as a result of which the alignment of the probe tips 48a is misaligned. Also, when the contactor area 50 is deflected at the time of being attached to the block 16, and the probe sheet main body 18 is fixed to the support surface 76 in a state where this deflection remains, the alignment of the probe tips 48a is misaligned in a similar manner.

However, by burying the reinforcing plate 70 corresponding to the contactor area 50 of the probe sheet main body 18 in the probe sheet main body 18, the aforementioned deformation on the contactor area 50 of the probe sheet main body can be prevented reliably. Thus, the misalignment of the posture of each probe or contactor 48 caused by deformation of the contactor area 50 may be prevented, and the misalignment of the probe tip 48a of this contactor 48 may be prevented reliably. This leads to easy handling of the probe sheet 20 and provides a probe assembly 10 with the probe tips 48a having high positional accuracy.

Next, a method for manufacturing the probe sheet 20 according to an embodiment of the present invention is described with reference to FIGS. 6 to 13. For simplification of description and drawings, the following embodiment is described in terms of a single probe representing a plurality of contactors or probes formed at the same time.

First Step

Figure 6:
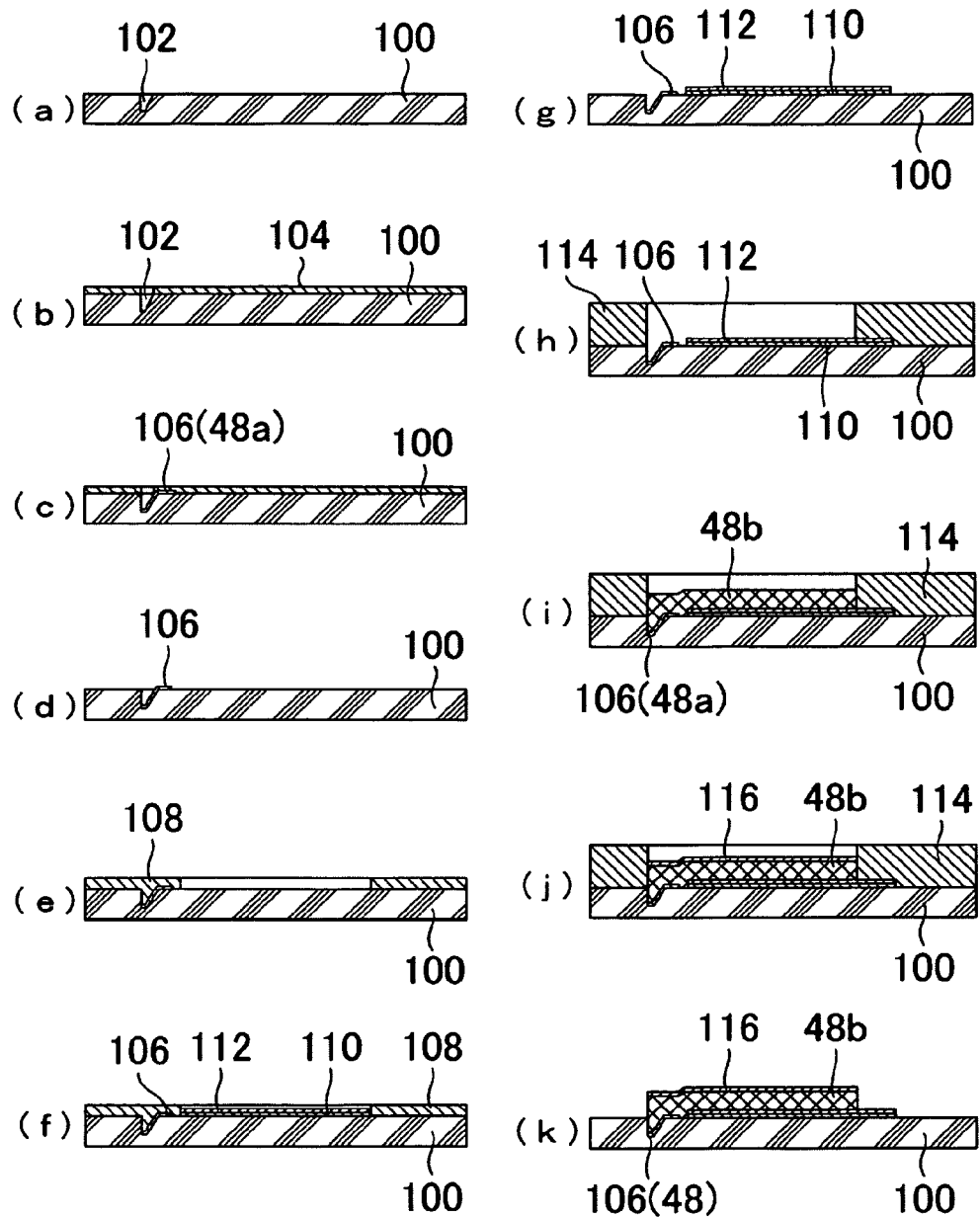
FIG. 6 is a process description diagram (No. 1) showing a process for manufacturing the probe sheet according to an embodiment of the present invention.

In the method for manufacturing the probe sheet according to an embodiment of the present invention, a metal plate such as a stainless steel plate is used as a base table 100, and on its surface is formed a hitting mark by, for example, an indenter to form a recess 102 for the probe tip of the probe 48, as shown in FIG. 6 (a). Meanwhile, although a single recess 102 is shown in the figure, as many recesses 102 as the number of the probes 48 to be formed on the aforementioned contactor area 50 are formed with a predetermined probe tip pitch, as is apparent from the above description.

After formation of the recess 102, a pattern mask 104 that takes the form of the probe tip 48a of the probe 48 is formed at an area including the recess 102 by selective exposure and development processing with photoresist with use of a photolithographic technique (FIG. 6 (b)).

With use of this pattern mask 104, a metal 106 for the probe tip 48a is deposited in and around the recess 102 by, for example, electroplating (FIG. 6 (c)). As a metal material for the probe tip 48a, a hard metal such as rhodium or palladium-cobalt alloy is used. After deposition of the metal 106, the pattern mask 104 is removed (FIG. 6 (d)).

After removal of the pattern mask 104, a pattern mask 108 for a sacrificial layer to be removed after completion of the probe sheet 20 is formed on the base table 100 with photoresist with use of the aforementioned photolithographic technique, as shown in FIG. 6 (e).

For the aforementioned sacrificial layer, a nickel layer 110 is first deposited at an area where the base table 100 is exposed from the pattern mask 108 by, for example, a plating technique. Subsequently, a copper layer 112 is deposited on the nickel layer 110 by a similar plating technique. On the base table 100, a metal material for forming an arm portion 48b as a main body of the probe 48 will be deposited later on, and the copper layer 112 functions to make it easy to detach the probe main body formed by the deposition of the metal material from the base table 100. Also, the copper layer 112 is deposited over the base table 100 via the nickel layer 110 because it may be difficult to deposit the copper layer 112 directly on the base table 100.

After formation of the aforementioned sacrificial layers 110, 112, the pattern mask 108 is removed (FIG. 6 (g)). Thereafter, a pattern mask 114 for the arm portion, continuing into the probe tip 48a, of the probe 48 is formed with photoresist similar to one described above (FIG. 6 (h)). In an area exposed from the pattern mask 114, a metal material for the arm portion of the probe 48 is deposited on the metal 106 for the probe tip 48a and the sacrificial layers 110, 112 by a plating technique such as an electroforming technique. In this manner, the arm portion 48b is formed integrally with the probe tip 48a that is the metal 106 (FIG. 6 (i)). As a metal material for the arm portion 48b, a nickel-phosphor alloy is used, for example.

In a state where the pattern mask 114 remains, a copper layer 116 that functions as a protective film in an after-mentioned process is formed on the arm portion 48b by, for example, a plating technique (FIG. 6 (j)). After formation of this copper layer 116, the pattern mask 114 is removed (FIG. 6 (k)).

After formation of the arm portion 48b, a second sacrificial layer that will be a reference plane of the probe sheet main body 18 is formed. Prior to formation of this second sacrificial layer, a pattern mask 118, made of photoresist, selectively covering the arm portion 48b with which the probe tip 48a has been formed integrally on the base table 100 is formed by a photoresist technique similar to one described above (FIG. 7 (a)). At an area exposed from the pattern mask 118 over the base table 100 is deposited a metal material for a second sacrificial layer 120 (FIG. 7 (b)). Nickel may be used as a material for the second sacrificial layer 120 and may be deposited by a plating technique.

After formation of the second sacrificial layer 120, the pattern mask 118 covering the arm portion 48b is removed (FIG. 7 (c)). Thereafter, a resist mask 122 made of photoresist for partially removing the copper layer 116 on the arm portion 48b is formed entirely over the base table 100 with only an unnecessary part of the protective film that is the copper layer 116 exposed (FIG. 7 (d)).

When the unnecessary part of the copper layer 116 exposed from the resist mask 122 is removed by etching (FIG. 7 (e)), the resist mask 122 is removed (FIG. 7 (f)). This removal of the unnecessary part of the copper layer 116 prevents the elasticity of the arm portion 48b with flexible deformation from being impaired by the copper layer 116. Thus, predetermined elasticity of the probe 48 is maintained.

Second Step

After exposure of the second sacrificial layer 120 as a reference plane of the probe sheet main body 18 and the arm portion 48b on the base table 100 by removal of the resist mask 122, on these are sequentially formed a dry film 124 that is a third sacrificial layer, a resin layer 126 for the first electrical insulating synthetic resin film 62 of the probe sheet main body 18, and a protective film 128 made of resist (FIG. 7 (g)).

Third Step

In a state where the surface of the resin layer 126 or the electrical insulating synthetic resin film 62 is protected by the protective film 128, an opening 130 reaching the copper layer 116 on the arm portion 48b is formed by using, for example, laser beam (FIG. 7 (h)). The lower edge of this opening 130 is an edge portion of the arm portion 48b located opposite the probe tip 48a and is opened on the copper layer 116. This copper layer 116 covers the upper surface of the arm portion 48b to protect the arm portion from the laser beam.

Fourth Step

After formation of the opening 130, the copper layer 116 in the opening 130 is removed by etching, and the arm portion 48b is exposed in the opening 130 (FIG. 7 (i)). In the opening 130 is deposited, for example, a nickel layer 132 for forming a base portion 48c of the probe 48 by a plating technique on the arm portion 48b to be integral with it. The thickness dimension of the nickel layer 132 in the opening 130 exceeds the thickness dimension of the dry film or the third sacrificial layer 124 but will not exceed the sum of the thickness dimensions of the sacrificial layer and the resin layer 126. Thus, the upper surface of the nickel layer 132 is located within the thickness region of the resin layer 126 for the electrical insulating synthetic resin film 62.

On the upper surface of the nickel layer 132 is deposited a copper layer 134 by a plating technique so as to be integrated with the nickel layer 132. Thus, the dissimilar metal joint area of these both metals 132, 134 exists within the thickness range of the resin layer 126 or the electrical insulating synthetic resin film 62. The aforementioned dissimilar metal joint area is hereby protected by the electrical insulating synthetic resin film 62. The copper layer 134 has a thickness dimension enough for its upper surface to approximately correspond to the upper surface of the resin layer 126. After deposition of the copper layer 134, the protective film 128 is removed (FIG. 7 (k)).

Fifth Step

On the resin layer 126 and the copper layer 134 exposed as a result of removal of the protective film 128 is formed a copper layer 136 having a thickness dimension of, for example, 0.3 μm for growing the conductive path 18a by sputtering, as shown in FIG. 8 (a).

Thereafter, as shown in FIG. 8 (b), a pattern mask 138 taking the form of the conductive path area including the upper portion of the copper layer 134 is formed with photoresist by a photolithographic technique. In an area exposed from the pattern mask 138 are sequentially deposited a copper layer 66 having a thickness dimension of 10 μm, a nickel layer 68 having a thickness dimension of 2 μm, and a copper layer 66 having a thickness dimension of 10 μm for the conductive path 18a by, for example, a plating technique (FIG. 8 (c)).

After the conductive path 18a is formed as a result of deposition of the copper layer 66, the nickel layer 68, and the copper layer 66, the pattern mask 138 is removed (FIG. 8 (d)), and a part of the copper layer 136 running off from the conductive path 18a is removed by etching (FIG. 8 (e)).

In this manner, the conductive path 18a excellent in strength against breakage can be formed as described above.

Sixth Step

On the resin layer 126 or the electrical insulating synthetic resin film 62, exposed as a result of removal of the pattern mask 138 and partial removal of the copper layer 136, and the conductive path 18a on the film, an adhesive sheet 72 made of a synthetic resin material is bonded, and the ceramic plate 70 covering the contactor area 50 is arranged on the sheet, as shown in FIG. 8 (f). Further, after a similar adhesive sheet 72 is arranged to cover the ceramic plate 70, a polyimide resin layer 140 for forming the other electrical insulating synthetic resin film 64 is deposited to cover them, as shown in FIG. 8 (g).

At the time of formation of this polyimide resin layer 140, a thrusting force F acts on the polyimide resin layer. Although part of this thrusting force F acts as a shearing force to the conductive path 18a at a part shown by a reference numeral 142 that is an edge portion of the base portion 48c of the probe 48 formed by deposition of the nickel layer 132 and the copper layer 134, the conductive path 18a, which has been reinforced by the second conductive material layer 68, will not be damaged by this shearing force.

Seventh Step

Figure 9:
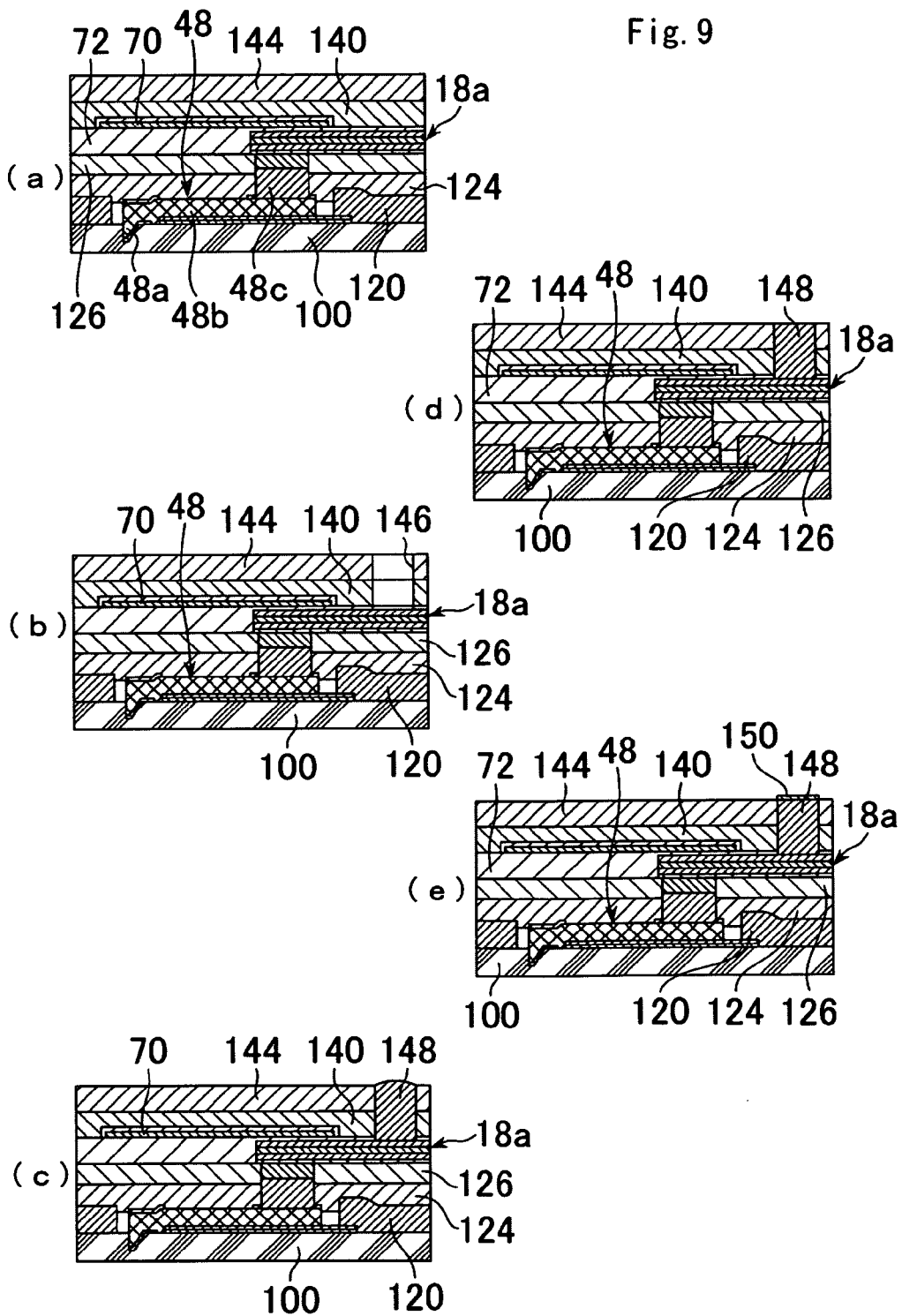
FIG. 9 is a process description diagram (No. 4) showing a process for manufacturing the probe sheet according to an embodiment of the present invention.

After formation of the polyimide resin layer 140, a dry film 144 is bonded on the polyimide resin layer as a fourth sacrificial layer (FIG. 9 (a)). Thereafter, as shown in FIG. 9 (b), an opening 146 opened on the conductive path 18a via the fourth sacrificial layer 144 and the underlying polyimide resin layer 140 is formed by laser beam.

In this opening 146 is deposited a metal material for a pad or a bump 148 by plating, as shown in FIG. 9 (c). As a metal material for the bump 148, nickel may be deposited, for example.

Eighth Step

A part of the bump 148 protruded from the surface of the fourth sacrificial layer 144 undergoes an abrasion process so as to be flat (FIG. 9 (d)), and on this flat surface is formed a gold layer 150 for favorable electrical contact with the aforementioned wiring path of the aforementioned rigid wiring board 12 by, for example, a plating technique.

After formation of the gold layer 150, the probe sheet main body 18 is removed from the base table 100 together with the second sacrificial layer 120, the fourth sacrificial layer 144, and so on, as shown in FIG. 10 (a). At this moment, even if a part of the detaching force acts as a bending force on the contactor area 50 of the probe sheet main body 18 via the probes 48, deformation of the contactor area 50 is restricted by the reinforcing plate 70 buried inside the contactor area 50.

Accordingly, displacement of the posture of each probe 48 and the probe tip 48a caused by this detachment is prevented.

After removal of the base table 100 as a result of detachment of the probe 48, the aforementioned first sacrificial layer consisting of the nickel layer 110 and the copper layer 112 and the second sacrificial layer 120 are respectively removed by an etching process (FIG. 10 (b)). Also, the dry film 124 exposed as a result of removal of the second sacrificial layer 120 is removed, and further the fourth sacrificial layer 144 is removed (FIG. 10 (c)).

Ninth Step

Figure 11:
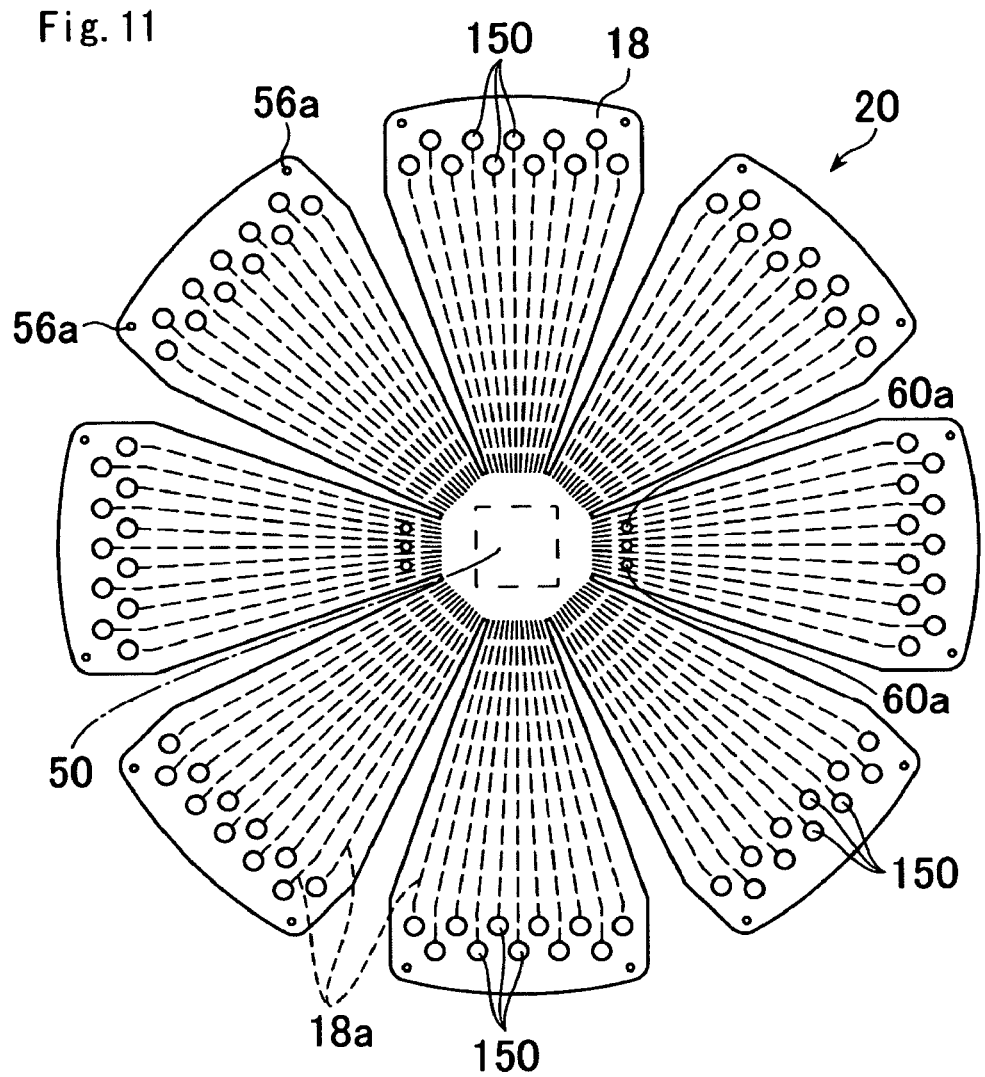
FIG. 11 is a plan view of the probe sheet according to an embodiment of the present invention.

Thereafter, as shown in FIG. 11, the outline of the probe sheet main body 18 is set by a laser process or a cutting process by means of a cutter, and openings 56a that receive the positioning pins 56 and the elongated holes 60a that receive the alignment pins 60 are respectively formed at locations that are not in the way of the conductive paths 18a of the probe sheet main body 18, thus to form the probe assembly 10.

With the aforementioned method for manufacturing the probe sheet 20 according to an embodiment of the present invention, the probe tip 48a, the arm portion 48b, and the base portion 48c of each probe 48 required to have extremely high accuracy are sequentially formed on the base table 100. Also, in a state where each probe 48 is held on the base table 100, the probe sheet main body 18 to be coupled with this probe 48 is formed integrally with the probe 48.

Accordingly, since operations to couple the probes or the contactors 48 with the probe sheet main body 18 individually are not needed, and associated positional adjustment operations of the probe tips 48a of the contactors 48 are not needed, the probe sheet 20 on which the probe tip 48a of each contactor 48 is arranged accurately at a predetermined position can be manufactured more easily than in the conventional case. Also, sequential steps from formation of the probe tip 48a to arrangement of the outer shape of the probe sheet main body 18 for completion of the probe sheet 20 can be performed efficiently by a continuous operation.

Also, in the first step for forming the probe tip 48a and the arm portion 48b of the contactor 48, prior to deposition of the metal material for the arm portion 48b on the base table 100, a harder metal material than the metal material for the arm portion 48b can be deposited in the recess 102 of the base table 100. After deposition of this hard metal material, the metal material for the arm portion 48b is deposited to cover the metal material to enable to form the probe tip 48a of each contactor 48 with the hard metal material, and thus it is possible to heighten abrasion resistance of the probe tip 48a of each contactor 48 and improve durability of each contactor 48.

Figure 12:
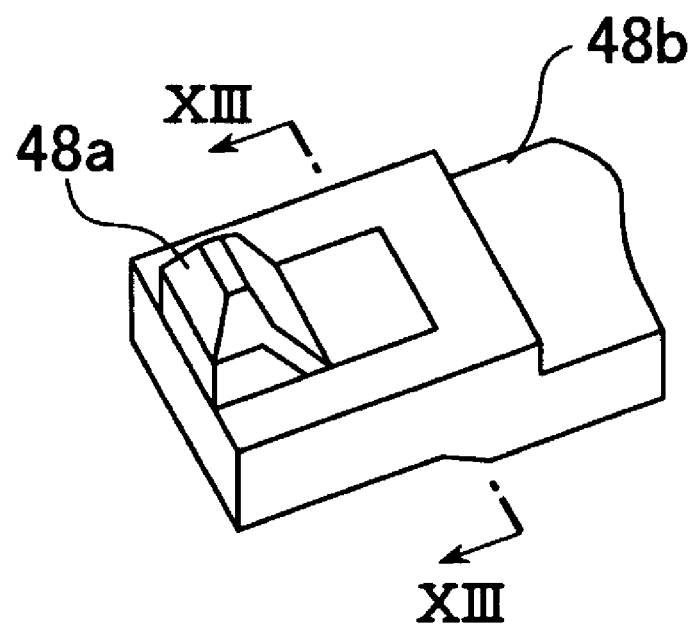
FIG. 12 is a perspective view of the probe tip of a probe according to an embodiment of the present invention seen from its tip end side.
Figure 13:
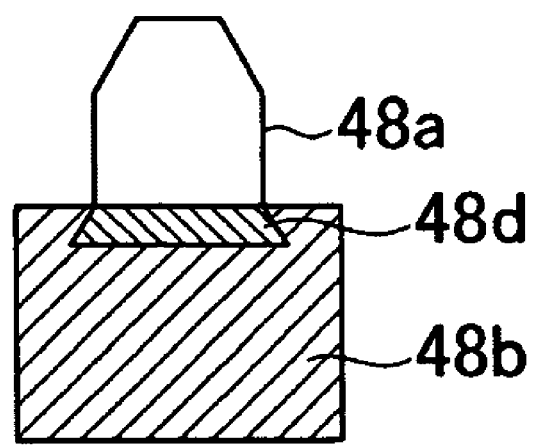
FIG. 13 is a cross-sectional view obtained along the line XIII-XIII shown in FIG. 12.

In this first step, the photolithographic technique may be used for formation of the probe tip 48a as described above. By using this photolithographic technique, a skirt portion 48d whose width dimension increases toward the end surface in accordance with the end surface shape of the edge portion of the pattern mask 104 is formed at both edge portions of the probe tip 48a made of the metal 106, as shown in FIGS. 12 and 13. Since the arm portion 48b is formed by deposition of the metal material so as to cover this skirt portion 48d, so-called dovetail coupling is made at the coupling portion between the probe tip 48a and the arm portion 48b. Consequently, strong coupling may be obtained between both the portions 48b and 48d.

Also, in the aforementioned fourth step, the same material as the arm portion 48b is deposited in the opening 130 for the base portion 48c at a height position that exceeds the height position of the sacrificial layer that is the dry film 124 and that does not exceed the first flexible synthetic resin layer 126. Thereafter, copper, which is the same material as a metal material for the conductive path 18*a* is deposited on the base portion 48*b* in the opening 130 within the thickness dimension of the first flexible synthetic resin layer 126. As a result, since the connection boundary between the base portion 48*c* of the contactor 48 and the conductive path 18*a* made of a different metal material from the base portion may be located substantially within the first flexible synthetic resin layer 126 (62), the connection boundary between both the metals may be protected by the first flexible synthetic resin layer 126 (62).

In the fifth step for forming the conductive path 18*a*, the first conductive material layer 66, the second conductive material layer 68 having higher toughness than the first conductive material layer, and the aforementioned first conductive material layer 66 for the conductive path 18*a* may be deposited sequentially on the first flexible synthetic resin layer 126 (62). Thus, the conductive path 18*a* may be in a three-layered structure, and the strength of the conductive path 18*a* against breakage can be heightened.

Also, in this fifth step, after formation of the conductive path 18*a*, the reinforcing plate 70 covering the upper region of the contactor 48 may be fixed over the first flexible synthetic resin layer 126 (62) and the conductive path 18*a* via the adhesive sheet 72. The arrangement of the reinforcing plate 70 may restrict deformation by an external force or deformation by thermal expansion or contraction on the contactor area 50 provided with the respective contactors 48 at the time of detachment of the contactors 48 of the probe sheet main body 18 from the base table 100 in the process of forming the probe sheet 20 or in handling of the probe sheet main body 18 in attachment of the probe sheet 20 to the block 16 or the rigid wiring board 12 etc. and can restrict displacement in the probe tip positions of the contactors caused by these deformations, as described above.

The present invention is not limited to the above embodiments but may be altered in various ways without departing from the spirit and scope of the present invention.

The invention claimed is:

1. A method for manufacturing a probe sheet comprising a probe sheet main body having a flexible insulating synthetic resin film and conductive paths supported by said synthetic resin film and a plurality of contactors formed to be protruded from one surface of said probe sheet main body and connected to said conductive paths, comprising:
a first step of forming photoresist taking the form of each probe tip and each arm portion continuing into said probe tip on a base table having formed therein a recess for said probe tip of each contactor with use of a photolithographic technique and forming said probe tip and said arm portion of said contactor by depositing a metal material in said recess formed in said photoresist;
a second step of, after removal of said photoresist, forming a sacrificial layer on the end portion of said arm portion and forming a first flexible synthetic resin layer for said probe sheet main body on said sacrificial layer;
a third step of forming an opening reaching said arm portion via said flexible synthetic resin layer and said sacrificial layer;
a fourth step of forming a base portion continuing into said arm portion of said contactor by depositing a metal material in said opening; and
a fifth step of forming on said flexible synthetic resin layer photoresist taking the form of a conductive path passing on said base portion formed in said opening with use of a photolithographic technique and forming on said synthetic resin layer said conductive path coupled with said base portion by depositing a metal material in a recess formed in said photoresist,
wherein said contactors are separated from said base table integrally with said probe sheet main body.

2. The manufacturing method according to claim 1, wherein said base table comprises a stainless steel plate, said metal material for said contactor is nickel or its alloy, and said first step includes the step of, prior to deposition of said metal material for said arm portion on said base table, sequentially laminating a nickel layer for promoting growth of a copper layer on said base table for easy detachment of said arm portion from said base table and said copper layer on said nickel layer and depositing said metal material for formation of said arm portion on said base table via said both layers.

3. The manufacturing method according to claim 2, wherein deposition of said metal material for said arm portion and lamination of said nickel layer and said copper layer are respectively conducted by a plating technique.

4. The manufacturing method according to claim 1, wherein said first step includes the step of, prior to deposition of said metal material for said arm portion on said base table, depositing a harder metal material than said metal material for said arm portion in said recess on said base table, and after deposition of said metal material, depositing said metal material for said arm portion to cover said metal material.

5. The manufacturing method according to claim 4, wherein said hard metal material is rhodium or palladium-cobalt alloy, and said metal material is deposited by a plating technique.

6. The manufacturing method according to claim 1, wherein said third step is conducted by irradiation of laser beam to said first flexible synthetic resin layer and said sacrificial layer in a state where the upper surface of said arm portion under said sacrificial layer is protected by a protective film.

7. The manufacturing method according to claim 6, wherein said protective film is a plated copper layer formed on the upper surface of said arm portion prior to said second step.

8. The manufacturing method according to claim 1, wherein said fourth step includes the step of depositing in said opening the same material as said metal material for said arm portion at a height position that exceeds the height position of said sacrificial layer and that does not exceed said first flexible synthetic resin layer to form said base portion and subsequently depositing in said opening on said base portion the same material as said metal material for said conductive path within the thickness dimension of said first flexible synthetic resin layer.

9. The manufacturing method according to claim 1, wherein said fifth step includes the step of sequentially laminating a first conductive material, a second conductive material having higher toughness than that of said first conductive material, and said first conductive material for said conductive path on said first flexible synthetic resin layer, thus to form said conductive path having a three-layered structure.

10. The manufacturing method according to claim 9, wherein said first conductive material is copper, said second conductive material is nickel or its alloy, and these are sequentially deposited by a plating technique.

11. The manufacturing method according to claim 1, wherein said fifth step includes the step of, after formation of said conductive path, fixing a reinforcing plate covering the upper region of said contactor over said first flexible synthetic resin layer and said conductive path via an adhesive sheet.

12. The manufacturing method according to claim 1, further comprising a sixth step of forming a second flexible synthetic resin layer covering said conductive path formed on said first flexible synthetic resin layer for the purpose of burying said conductive path in cooperation with said first flexible synthetic resin layer.

13. The manufacturing method according to claim 12, further comprising a seventh step of forming a sacrificial layer on said second flexible synthetic resin layer, forming an opening reaching said conductive path via said second flexible synthetic resin layer and said sacrificial layer on said second flexible synthetic resin layer, and depositing a metal material in said opening, thus to form a bump for said conductive path and an eighth step of abrading the surface of said bump to correspond to the surface of said sacrificial layer on said second flexible synthetic resin layer, wherein, after detaching said contactor from said base table integrally with said probe sheet main body, said each sacrificial layer remaining on said probe sheet is removed.

14. The manufacturing method according to claim 13, further comprising a ninth step of arranging the outer shape of said probe sheet main body formed by burying said conductive path in said first and second flexible synthetic resin layers.

* * * * *